United States Patent [19]

Heminger et al.

[11] Patent Number: 5,686,857

[45] Date of Patent: Nov. 11, 1997

[54] ZERO-CROSSING TRIAC AND METHOD

[75] Inventors: David M. Heminger, Mesa; Paul G. Alonas; William M. Coppock, both of Scottsdale, all of Ariz.

[73] Assignee: Motorola, Inc., Schaumburg, Ill.

[21] Appl. No.: 596,036

[22] Filed: Feb. 6, 1996

[51] Int. Cl.$^6$ .................................................. H03K 17/13
[52] U.S. Cl. ........................ 327/451; 327/452; 327/455
[58] Field of Search ................................. 327/419, 420, 327/445, 446, 451, 452, 453, 454, 455; 257/124, 125

[56] References Cited

U.S. PATENT DOCUMENTS

| Re. 33,209 | 5/1990 | Plummer | 357/23.4 |
|---|---|---|---|
| 4,015,143 | 3/1977 | Tokunaga et al. | 307/252 |
| 4,063,115 | 12/1977 | Okuhara et al. | 307/252 |
| 4,084,110 | 4/1978 | Okuhara et al. | 307/252 |
| 4,224,634 | 9/1980 | Svedberg | 357/38 |
| 4,365,170 | 12/1982 | Okuhara | 257/125 |
| 4,396,932 | 8/1983 | Alonas et al. | 357/39 |
| 4,458,408 | 7/1984 | Alonas et al. | 29/576 |
| 4,553,041 | 11/1985 | Yim | 327/452 |
| 4,774,420 | 9/1988 | Sutton | 307/270 |
| 5,138,415 | 8/1992 | Yano | 357/30 |
| 5,293,051 | 3/1994 | Mariyama et al. | 257/129 |
| 5,346,838 | 9/1994 | Ueno | 437/7 |

Primary Examiner—Timothy P. Callahan
Assistant Examiner—Jeffrey Zweizig
Attorney, Agent, or Firm—Robert F. Hightower

[57] ABSTRACT

A triac (100) utilizes an FET (107) to inhibit firing of a transistor (112) that forms a portion of the SCR of the triac (100). A DMOS transistor (106) is used to supply a substantially constant bias current to the transistor (107) in order to facilitate rapid turn-on of the transistor (107) around the zero-crossing of the voltage applied to the triac (100).

14 Claims, 3 Drawing Sheets

ZERO-CROSSING TRIAC AND METHOD

BACKGROUND OF THE INVENTION

The present invention relates, in general, to semiconductor devices, and more particularly, to semiconductor triacs.

In the past, the semiconductor industry has utilized a variety of circuits for forming triacs. Typically, a triac is formed in two sections, an input or gating section and an output section that is optically coupled to the gating section. The output section generally includes two bipolar transistors configured as a lateral semiconductor controlled rectifier (SCR). The SCR is enabled by light from the gating section, and disabled by a transistor. A photo diode coupled to the transistor supplies bias current to the transistor so that the transistor may be enabled in order to inhibit the SCR from firing at times other than the zero-crossing of the input waveform.

One problem with the prior art implementation is the operation when the photodiode is operated at very low current levels. Under such conditions, the photodiode provides very little light to the inhibit transistor. Consequently, the photodiode is only supplying leakage current which typically is insufficient for inhibiting the operation of the SCR. Consequently, the SCR may trigger prior to the zero-crossing region thereby causing excessive noise and current spikes.

Accordingly, it is desirable to have a triac that is enabled within a small window around the zero-crossing of voltage or waveform applied to the triac.

DETAILED DESCRIPTION OF THE DRAWINGS

Figure 1:
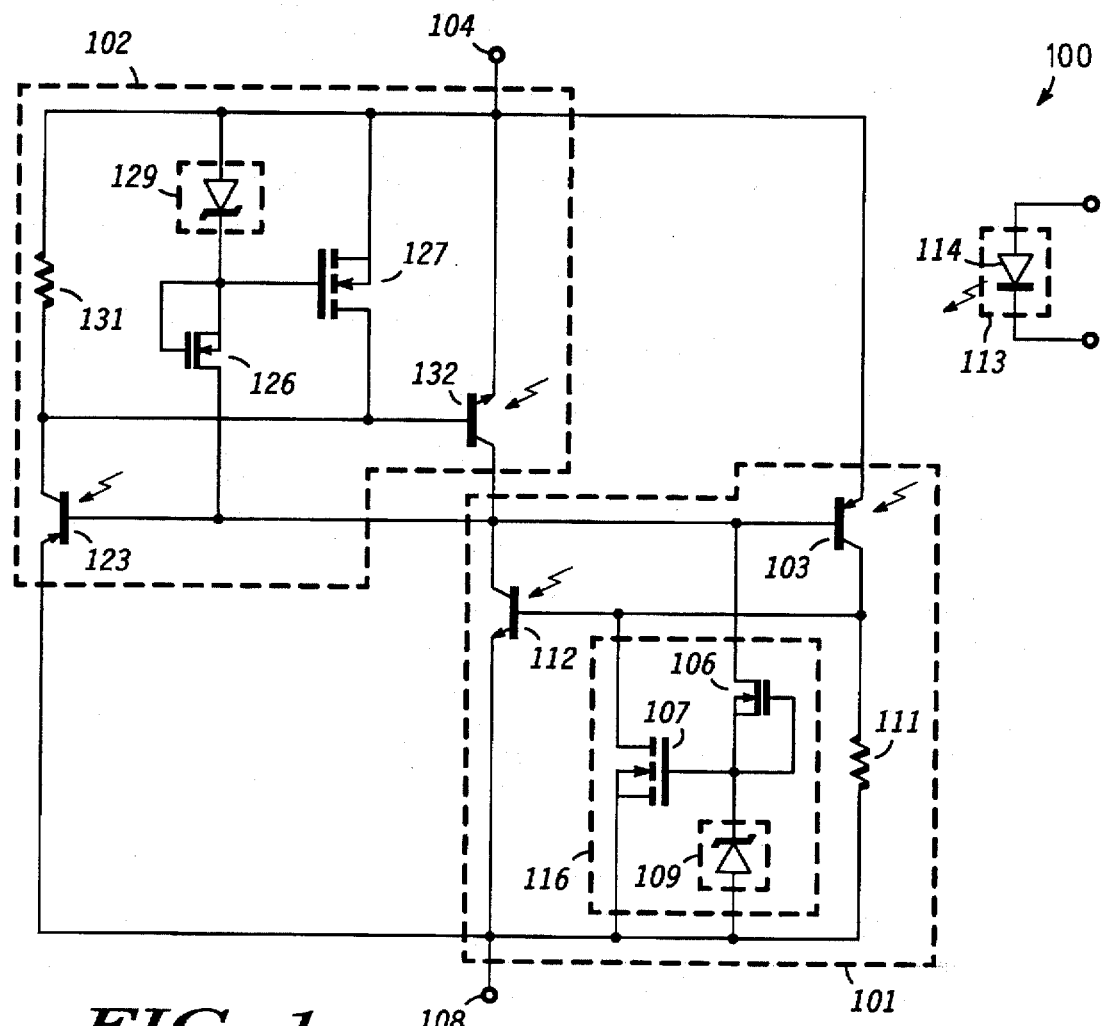
FIG. 1 schematically illustrates a portion of a triac circuit in accordance with the present invention.

FIG. 1 schematically illustrates a portion of a circuit suitable for implementing a zero-crossing triac 100. Triac 100 includes a gating section 113 and an output section having substantially identical output stages 101 and 102. Gating section 113 is electrically isolated from the output section but includes an optical emitter 114 that is utilized to optically couple section 113 to the output section. As will be seen hereinafter, emitter 114 emits light that is utilized to provide base current for transistors within stages 101 and 102. Typically, emitter 114 is a light emitting diode (LED).

Stage 101 includes a high breakdown voltage transistor 103 that typically is a PNP or first conductivity type transistor. Transistor 103 typically has a breakdown voltage of at least 600 volts in order to withstand the high line voltages applied across transistor 103. A first current electrode or emitter of transistor 103 is connected to a first terminal 104 of triac 100 while a second current electrode or collector is connected to a control electrode or base of a transistor 112. Transistors 103 and 112 are formed to function as a semiconductor control rectifier (SCR). Consequently, transistor 112 typically is an NPN or second conductivity type transistor. A first current electrode or collector of transistor 112 is connected to a control electrode or base of transistor 103 while a second current electrode or emitter is connected a second terminal 108 of triac 100. Because transistors 103 and 112 are formed as a SCR, the base of transistor 112 typically is formed as the collector portion of transistor 103.

Stage 101 also includes a zero-crossing detection circuit 116 that is utilized to prevent enabling transistor 112, thus, inhibit firing the SCR, except when the voltage applied to terminals 104 and 108 is near a zero-crossing point. An enhancement mode field effect transistor (FET) 107 is connected across the base emitter junction of transistor 112 by having a first current electrode or source connected to the emitter of transistor 112 and a second current electrode or drain connected to the base of transistor 112. Consequently, when transistor 107 is active, the base emitter junction of transistor 112 is shorted thereby disabling transistor 112 which prevents the SCR from firing. The voltage limiting circuit 109 is connected between a control electrode or gate of transistor 107 and terminal 108. Circuit 109 limits the voltage applied to the gate of transistor 107 in order to prevent applying a voltage that could rupture the gate of transistor 107. Typically, transistor 107 has a gate oxide thickness that is between approximately eighty and three hundred nanometers thick. In the preferred embodiment, transistor 107 is a lateral transistor and has a gate oxide no greater than approximately two hundred nanometers. Such a gate oxide thickness results in transistor 107 having a threshold voltage that is well controlled. Typically, the threshold voltage is less than ten volts. In the preferred embodiment, the threshold voltage is no greater than approximately three volts. Such low threshold voltages assist in ensuring that transistor 107 turns-on with a window of approximately the threshold voltage around the zero-crossing of the signal applied to terminals 104 and 108, as will be seen hereinafter.

Typically, circuit 109 is a zener diode having a zener voltage that is less than the gate rupture voltage of transistor 107. Additionally, the voltage applied to the gate of transistor 107 must be allowed to exceed the threshold voltage of transistor 107. Consequently, the zener voltage must be greater than the threshold voltage of transistor 107.

A depletion mode double diffused metal oxide semiconductor (DMOS) transistor or bias current transistor is utilized to supply gate current to transistor 107. Transistor 106 has a first current electrode or drain connected to the base of transistor 103 and a second current electrode or source connected to both the gate of transistor 107 and to a control electrode or gate of transistor 106. Typically, transistor 106 is an N-channel metal gate transistor in order to improve the manufacturability of transistor 106. Because of the gate to source connection, transistor 106 operates in an $I_{DSS}$ mode which results in transistor 106 providing a constant current once the drain-to-source voltage reaches the pinch-off voltage required for the channel of transistor 106. Additionally, as will be seen hereinafter, transistor 106 rapidly saturates at low currents so that transistor 106 substantially supplies a constant current to transistor 107. The drain current of transistor 106 is saturated at drain-to-source voltages no greater than approximately fifteen volts. In the preferred embodiment, the drain current of transistor 106 saturates at source-to-drain voltages no greater than three volts. Typically, the drain current of transistor 106 saturates at values between fifty and one hundred nanoamps. Any current in excess of that required to enable transistor 107 is shunted by circuit 109. Because of the low saturation current of transistor 106, circuit 109 only has to handle small excess currents thereby preventing the destruction of circuit 109 and extending the lifetime thereof. Additionally, such low excess current resulting from the low saturation current, reduces the leakage current of triac 100. A resistor 111 is connected between the collector of transistor 103 and terminal 108. Resistor 11 typically has a value between thirty kilo-ohms and one hundred fifty kilo-ohms in order to reduce the noise sensitivity and false triggering of triac 100.

In operation, transistor 106 is substantially supplying the constant current to transistor 107 so that transistor 107 may rapidly turn on when the voltage between terminals 104 and 108 exceeds the threshold voltage of transistor 107. When the voltage between terminals 104 and 108 is zero, transistor 107 is substantially disabled. If section 113 is generating light in order to provide base current to transistors 112 and 103, transistors 112 and 103 are enabled and current flows between terminals 104 and 108 thereby latching the SCR is an ON condition. As the voltage across terminals 104 and 108 increase above the threshold voltage of transistor 107, transistor 107 is enabled and shorts the base-emitter voltage of transistor 112. Because the SCR is latched ON, the SCR continues to conduct until the voltage between terminals 104 and 108 approach zero. If section 113 is disabled so that no base current is supplied to transistors 103 and 112, the SCR will stop conducting as the voltage across terminals 104 and 108 becomes zero. As the voltage increases above the threshold voltage of transistor 107, transistor 107 once again shorts transistor 112 ensuring that the SCR remains OFF. If thereafter section 113 again generates light to provide base current to transistors 103 and 112, the SCR remains OFF because transistor 107 is enabled. As the voltage across terminals 104 and 108 drops below the threshold voltage of transistor 107 while approaching zero, transistor 112 and 103 are enabled thereby latching the SCR in ON condition. As a voltage between terminals 104 and 108 cross through zero and continue, the SCR remains ON even though transistor 107 becomes enabled. Consequently, it can be seen that triac 100 turns on within a window around the zero-crossing of the voltage applied between terminals 104 and 108. This window is substantially the threshold voltage of transistor 107. Because the threshold voltage of transistor 107 is low, triac 100 accurately detects the zero-crossing and becomes enabled during the zero-crossing of the voltage applied between terminals 104 and 108. To facilitate such a zero-crossing, the threshold voltage can be as low as three volts, but typically is about seven to ten volts.

Because transistor 106 saturates at such a very low voltage and supplies a constant current upon reaching the saturation voltage, transistor 107 turns on rapidly when the voltage between terminals 104 and 108 increases above the threshold voltage of transistor 107. Thus, triac 100 has a very narrow turn-on window around the zero crossing of the signal wave form. Additionally, because very little current flows through circuit 109, triac 100 has a very low external leakage current, typically fifty to two hundred fifty nanoamps, which minimizes false triggering of external drivers or loads connected to triac 100.

Because of the constant current supplied by transistor 106 to transistor 107, triac 100 turns-on quickly and does not have a delay caused by insufficient current supplied by a photo diode. Also, because transistor 106 supplies a constant current even at very high voltages, voltages in excess of one thousand volts, triac 100 has low leakage current even when the signal voltage between terminals 104 and 108 exceeds five to six hundred volts. This would not be the case if other types of transistors, for example, a junction field effect transistor (JFET), were used instead of transistor 106. JFETs typically turn-on when the source-to-drain voltage is high thereby having high leakage currents at high drain-to-source voltages, typically in excess of four hundred volts, which would cause a triac to have high external leakage current.

Stage 102 is substantially a mirror image of stage 101. Stage 102 has a transistor 123 that is similar to transistor 103, and a transistor 132 that is similar to transistor 112. Transistors 123 and 132 form an SCR similar to transistors 103 and 112. A transistor 127 is similar to transistor 107, and a transistor 126 is similar to transistor 106. Current limit circuit 129 is similar to circuit 109, and resistor 131 functions similar to resistor 111.

Figure 2:
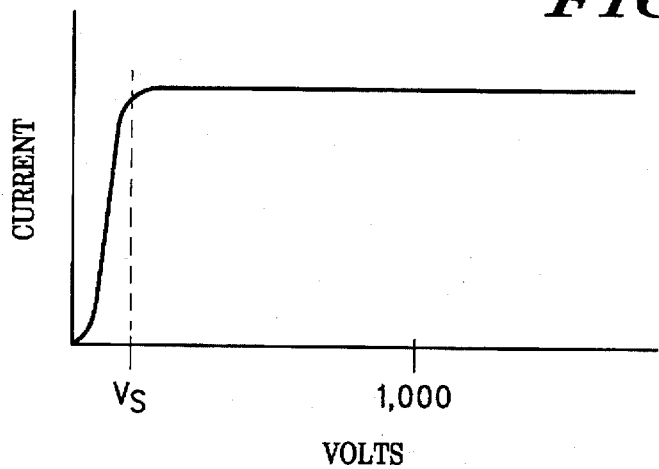
FIG. 2 is a graph illustrating characteristics of a portion of the triac of FIG. 1 in accordance with the present invention.

FIG. 2 is a graph illustrating the source-to-drain current versus the source-to-drain voltage of transistor 106. The ordinate indicates source-to-drain current while the abscissa indicates drain-to-source voltage applied to transistor 106. As shown in FIG. 2, transistor 106 rapidly turns on and supplies drain current as the voltage across transistor 106 increases from zero to saturation voltage $V_s$. Typically the saturation voltage $V_s$ is less than approximately fifteen volts, and the preferred embodiment is approximately three volts. At higher voltages, the drain current remains substantially constant even at voltages of one thousand volts and greater.

Figure 3:
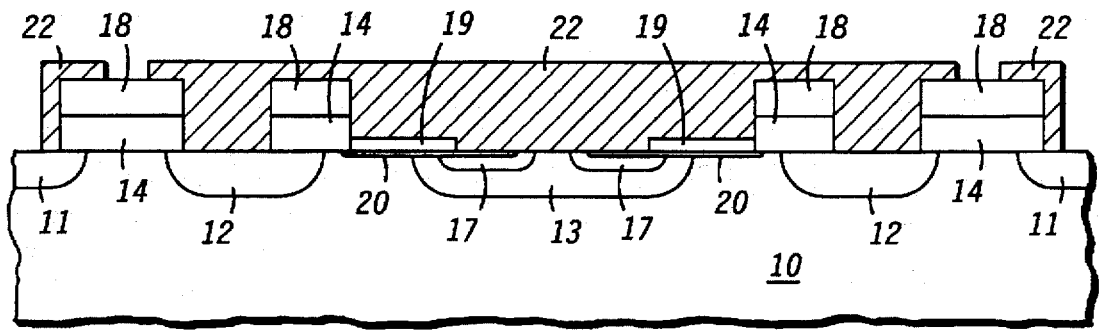
FIGS. 3–6 are enlarged cross-sectional views showing various stages in forming a current limiter portion of the triac of FIG. 1 in accordance with the present invention.

FIG. 3 is an enlarged cross-sectional view of a depletion mode metal gate vertical double diffused metal oxide semiconductor (DMOS) transistor or high voltage current limiter 15. DMOS transistor or high voltage current limiter 15 functions similar to transistors 106 and 126 shown in FIG. 1. The discussion hereinafter is to further explain transistor or limiter 15 and outline implementation methods for transistor or limiter 15. Limiter 15 will provide a relatively constant current flow between a silicon substrate 10, which has a backside that acts as a drain terminal, and a source region 17 when a saturation voltage potential is placed between the drain terminal and source region 17. The current limiting feature is provided by a channel implant region 20 which will carry only a maximum current from the drain terminal, across a channel region 13, and into source region 17. The presence of channel implant region 20 is not controlled by a gate voltage, and it is therefore ever-present. Since the flow of current is not modulated by a gate dielectric layer, current limiter 15 can be used in applications with an input voltage range of 100 volts to 2500 volts.

To support up to 2500 volts between the silicon substrate 10 and source region 17, a pinch-off structure 12 is formed such that the edge of pinch-off structure 12 is 1 μm to 50 μm from the edge of channel region 13. The conductivity of pinch-off structure 12 is the same as channel region 13 so when a voltage potential in excess of 100 volts is placed on silicon substrate 10, a depletion region (not shown) is formed between pinch-off structure 12 and channel region 13 to isolate the drain terminal from source region 17. As a result of the depletion region, the path of the current flow is from the drain terminal, across the depletion region, through channel implant region 20, and into source region 17. The depletion region not only supports up to 2500 volts, but as the voltage on silicon substrate 10 increases, the depletion region will widen and increase the probability that some of the current flow will recombine. This helps minimize the change in current flow as the voltage is increased, and results in a current limiter 15 with a stable current flow for voltages above the saturation voltage.

Portions of current limiter 15 are electrically connected together by a metallized layer 22. A dielectric layer 19 is used to ensure that metallized layer 22 does not contact the drain terminal or the portion of channel implant region 20 which is across channel region 13. As shown in FIG. 3, metallized layer 22 ensures that pinch-off structure 12, source region 17, and channel region 13 are at the same voltage potential. This also ensures that the presence of channel implant region 20 cannot be controlled by a voltage potential across dielectric layer 19 and prevents dielectric layer 19 from having to support a voltage potential. Since the surface of silicon substrate is not inverted, like in a traditional metal oxide field effect transistor (MOSFET), the only path for current across channel region 13 is through channel implant region 20 which provides the current limiting feature for current limiter 15.

Under high voltage operation, it is common for parasitic channels to form near the surface of a device due to the presence of defects which conduct leakage currents. For high voltage applications, current limiter 15 includes edge termination structures 11 which are used to terminate any current which may be flowing near the surface of the drain terminal. It should also be understood that current limiter 15 is also applicable to current limiting applications below 100 volts. Below 100 volts it is possible that the depletion region will not completely isolate the area between pinch-off structure 12 and channel region 13. As a result, current will flow from the drain terminal, across channel implant region 20, and into source region 17. But again, since channel implant region 20 is not modulated, it will only conduct a limited amount of current.

A method for forming current limiter 15, shown in FIG. 3, will now be provided such that silicon substrate 10 and source region 17 are of n-type conductivity. It should be understood that current limiter 15 can also be formed such that silicon substrate 10 and source region 17 are of p-type conductivity by changing all n-type doped regions to p-type and vice versa. FIGS. 3–6 are enlarged cross-sectional views of current limiter 15 at various stages of fabrication, and FIG. 3 shows the completed current limiter 15.

Figure 4:
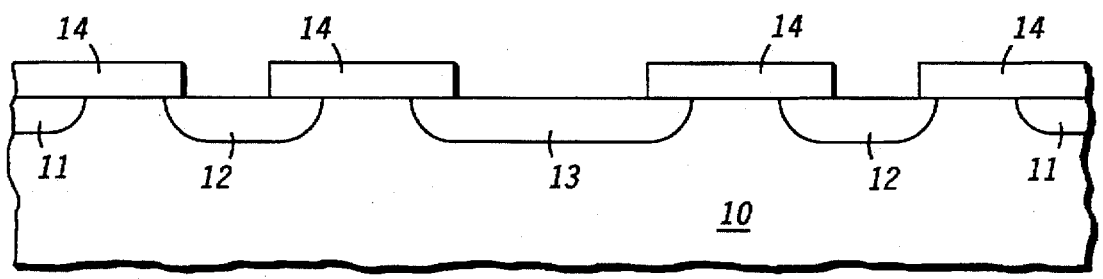

FIG. 4 is an enlarged cross-sectional view of current limiter 15 early in the fabrication process. Current limiter 15 is preferably formed in a silicon substrate 10 which acts as the drain terminal. Silicon substrate 10 can also be a body of semiconductor material made from epitaxial or float zone material. Silicon substrate 10 is doped to have a resistivity of 5 ohm-cm to 50,000 ohm-cm which improves the high voltage characteristics of current limiter 15. A first masking layer 14, preferably of silicon dioxide, is formed on the surface of silicon substrate 10 using a chemical vapor deposition (CVD) process based on the decomposition of tetraethylorthosilicate (TEOS) at 650° C. to 950° C. or the thermal oxidation of silicon substrate 10 in an oxygen rich ambient at 800° C. to 1200° C., or first masking layer 14 is deposited using a plasma enhanced chemical vapor deposition (PECVD) system at 200° C. to 400° C. First masking layer 14 has a thickness of about 4,000 Å to 20,000 Å with a preferred thickness of 8,000 Å.

A first photoresist layer of approximately 1 μm in thickness is then deposited and patterned to expose portions of first masking layer 14. The exposed portions of first masking layer 14 or then removed with either a wet etch buffered solution of hydrofluoric acid or a reactive ion etch (RIE) using a fluorine based ion. The first photoresist layer is then removed using a wet etch of sulfuric acid and peroxide. Silicon substrate 10 is then doped through the openings in first masking layer 14 to simultaneously form doped regions which become pinch-off structures 12 and channel region 13 respectively.

Doped regions 12 and 13 can be formed with either a boron implant or by diffusing a p-type species such as boron trifluoride into silicon substrate 10. Doped regions 12 and 13 are then annealed to activate the dopant and to move the edges of doped regions 12 and 13 away from the edges of first masking layer 14. An anneal of 900° C. to 1250° C. for 1 hour to 8 hours should be sufficient to activate the dopant. In the preferred embodiment, this drive in anneal takes place in a non-oxidizing ambient such as argon. The shape of the depletion region formed during operation of current limiter 15, can be adjusted by varying the doping concentration and profile of doped regions 12 and 13 and the distance between the edge of pinch-off structure 12 and channel region 13. This distance is typically 1 μm to 50 μm. The maximum voltage that current limiter 15 can support between the drain terminal and source region 17 is partially determined by the depth of pinch-off structure 12 and channel region 13. Pinch-off structure 12 and channel region 13 are typically 3 μm to 30 μm below the surface of silicon substrate 10.

Figure 5:
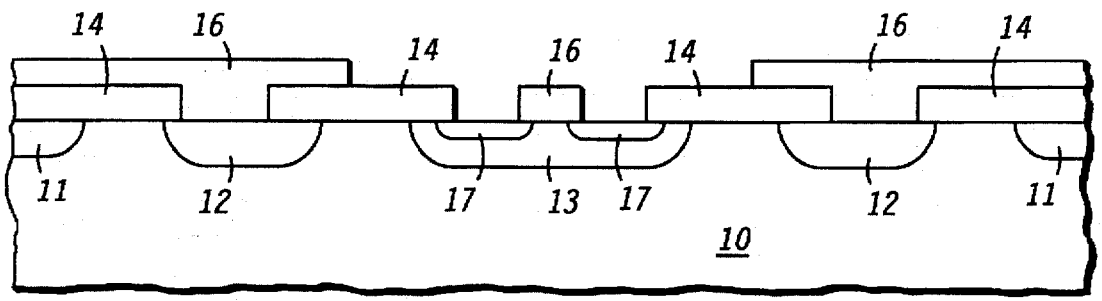

FIG. 5 is an enlarged cross-sectional view of current limiter 15 after further processing. A second masking layer 16, preferably made of photoresist, is formed over first masking layer 14 and the exposed portions of silicon substrate 10. Second masking layer 16 is patterned such that only portions of channel region 13 are exposed. The exposed portions of channel region 13 are then doped n-type to form source regions 17. A phosphorus implant with a dose of $5 \times 10^{13}$ atoms/cm$^2$ to $5 \times 10^{15}$ atoms/cm$^2$ at an energy of 50 keV to 100 keV is used to form the n-type regions. Second masking layer 16 is then removed so current limiter 15 can continue processing.

Figure 6:
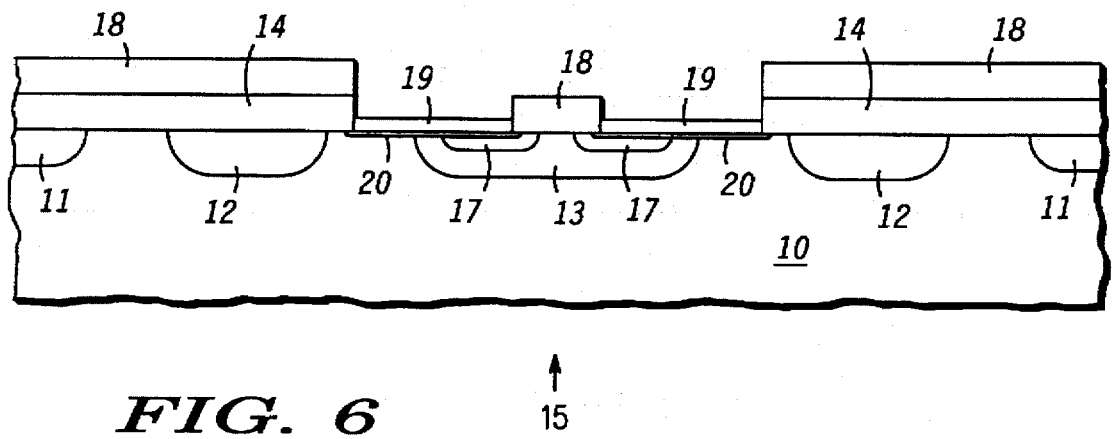

FIG. 6 is an enlarged cross-sectional view of current limiter 15 after even more processing. A third masking layer 18, preferably comprising silicon dioxide, is deposited with either a CVD or a PECVD deposition or grown from silicon substrate 10 with a thermal oxidation to a thickness of about 1,000 Å to 10,000 Å. An anneal at 900° C. to 1000° C. for 1 hour to 2 hours is performed to activate and drive the dopant used to form source regions 17. A third photoresist layer is then deposited and patterned to expose portions of third masking layer 18. An RIE etch using a chlorine or fluorine based ion is then used to selectively remove portions of third masking layer 18 and underlying first masking layer 14 to expose portions of silicon substrate 10, channel region 13, and source regions 17. The third photoresist layer is removed and a dielectric layer 19 is formed in the open portions of third masking layer 18. Dielectric layer 19 is preferably formed from silicon dioxide which is grown using a wet or dry oxidation in an oxygen rich ambient at 800° C. to 1200° C. to a thickness of about 100 Å to 5,000 Å. Channel implant region 20 is then formed by implanting through dielectric layer 19 with an n-type such as phosphorus. A dose of $5 \times 10^{11}$ atoms/cm$^2$ to $5 \times 10^{12}$ atoms/cm$^2$ with an energy of 50 keV to 100 keV is used to form channel implant region 20. It should also be understood that the n-type regions can also be formed using arsenic as the dopant species.

Referring back to FIG. 3 to complete processing of current limiter 15, a fourth photoresist layer (not shown) is then deposited and patterned to expose portions of third masking layer 18. An RIE etch using either a chlorine or a fluorine based ion is used to remove the exposed portions of third masking layer 18 and the underlying portions of first masking layer 14 to expose portions of pinch-off structure 12, source region 17, and channel region 13. It should also be understood that a comparable wet etch can be used to replace many of the RIE etch process. The fourth photoresist layer is then removed and a metallized layer 22 is either CVD deposited, sputtered, or evaporated over third masking layer 18, dielectric layer 19, and the exposed portions of pinch-off structure 12, source region 17, and channel region 13. Metallized layer 22 can be formed from either gold, aluminum, aluminum alloy, copper, tungsten, titanium, and titanium tungsten or the like.

A fifth photoresist layer is then deposited and patterned to expose portions of metallized layer 22. An RIE etch is then performed such that the portion of metallized layer 22 which is contacting edge termination structure 11 is electrically isolated from the portion of metallized layer 22 which is contacting pinch-off structure 12. Metallized layer 22 is patterned such that a portion of metallized layer 22 is simultaneously in contact with pinch-off structure 12, channel implant region 20, source region 17, and channel region 13. This will keep these regions in electrical contact with each other so that there is no significant voltage difference across dielectric layer 19. The fifth photoresist layer is then removed to allow further processing of current limiter 15.

The formation of edge termination structures 11 is optional depending on the voltage conditions current limiter 15 will operate under. If edge termination structures 11 are desired, they can be formed at any time prior to the deposition of metallized layer 22 using an additional implant mask such as photoresist and an implant using an n-type species such as phosphorus. To complete processing of current limiter 15, a passivation layer (not shown) of silicon nitride, amorphous silicon, borophosphosilicate glass (BPSG), or phosphosilicate glass (PSG) can be formed over all surfaces of current limiter 15 using a PECVD deposition process.

It should be noted that in the process flow described above, there is no need for the deposition of a polysilicon layer which in the prior art had been used in semiconductor processing to form gate structures. The amount of current that can pass through current limiter 15 is determined by the doping profile of channel implant region 20 and not on a channel which is modulated by a gate structure.

By now it should be appreciated that there has been provided a novel triac. Utilizing a transistor that turns-on rapidly and supplies a substantially constant current at very low voltages assists in providing the triac with a narrow zero-crossing window thereby minimizing noise generated by the triac. Utilizing a transistor that provides constant current at high voltages, minimizes the leakage current through the triac and also facilitates rapid turn-on of the triac. Additionally, inhibiting turn-on of the triac is not delayed by low light conditions also minimizing the zero-crossing window.

We claim:

1. A zero-crossing triac comprising:
   an SCR;
   a transistor used for inhibiting firing of the SCR; and
   a depletion mode DMOS transistor coupled to supply bias current to the transistor.

2. The triac of claim 1 wherein the bias current supplied by the depletion mode DMOS transistor is substantially constant from a saturation voltage to a source-to-drain voltage of at least 1000 volts.

3. The triac of claim 1 wherein the transistor is an enhancement mode FET coupled across a base emitter junction of the SCR.

4. The triac of claim 3 further including a voltage limiting circuit coupled between a gate and a drain of the transistor.

5. A zero-crossing triac comprising:
   a high breakdown voltage transistor of a first conductivity type having a first current electrode coupled to a first terminal of the triac, a control electrode, and a second current electrode;
   a depletion mode DMOS transistor having a first current electrode coupled to the control electrode of the high breakdown voltage transistor, a control electrode, and a second current electrode coupled to the control electrode;
   an enhancement mode FET having a first current electrode coupled to a second terminal of the triac, a control electrode coupled to the second current electrode of the depletion mode DMOS transistor, and a second current electrode coupled to the second current electrode of the high breakdown voltage transistor; and
   a voltage limiting circuit coupled between the second terminal of the triac and the control electrode of the enhancement mode FET.

6. The triac of claim 5 further including a transistor of a second conductivity type having a first current electrode coupled to the control electrode of the high breakdown voltage transistor, a control electrode coupled to the second current electrode of the high breakdown voltage transistor, and a second current electrode coupled to second terminal of the triac.

7. The triac of claim 6 further including a resistor coupled between the second current electrode of the high breakdown voltage transistor and the second terminal of the triac.

8. The triac of claim 7 wherein the resistor has a value no greater than 150 kilo-ohms.

9. The triac of claim 5 wherein the enhancement mode FET is a lateral transistor having a gate oxide no greater than 300 nanometers thick.

10. The triac of claim 5 wherein the depletion mode DMOS transistor is an N-channel metal gate depletion mode DMOS transistor.

11. The triac of claim 5 wherein the voltage limiting circuit is a zener diode having a zener voltage that is greater than a threshold voltage of the enhancement mode FET.

12. A method of forming a triac comprising:
   coupling a high voltage current limiter to a transistor used to inhibit firing of an SCR of the triac.

13. The method of claim 12 wherein coupling the high voltage current limiter includes coupling a DMOS transistor.

14. The method of claim 12 wherein coupling the high voltage current limiter includes using the high voltage current limiter that has a saturation voltage of no greater than fifteen volts and that provides a substantially constant current at source-to-drain voltages of up to at least 1000 volts.

* * * * *